United States Patent
Zhu et al.

(10) Patent No.: US 12,327,722 B2
(45) Date of Patent: Jun. 10, 2025

(54) EPITAXIAL GROWTH DEVICE

(71) Applicants: ZHEJIANG QIUSHI SEMICONDUCTOR EQUIPMENT CO., LTD, Hangzhou (CN); ZHEJIANG JINGSHENG M & E CO., LTD, Shaoxing (CN)

(72) Inventors: Liang Zhu, Hangzhou (CN); Wenjie Shen, Hangzhou (CN); Jiancan Zhou, Hangzhou (CN); Jiafeng Cheng, Hangzhou (CN); Qiucheng Zhang, Hangzhou (CN); Linjian Fu, Hangzhou (CN); Jianwei Cao, Hangzhou (CN); Kui Yang, Hangzhou (CN)

(73) Assignees: ZHEJIANG QIUSHI SEMICONDUCTOR EQUIPMENT CO., LTD, Hangzhou (CN); ZHEJIANG JINGSHENG M & E CO., LTD, Shaoxing (CN)

( * ) Notice: Subject to any disclaimer, the term of this patent is extended or adjusted under 35 U.S.C. 154(b) by 517 days.

(21) Appl. No.: 17/837,044

(22) Filed: Jun. 10, 2022

(65) Prior Publication Data
US 2022/0384192 A1 Dec. 1, 2022

Related U.S. Application Data

(63) Continuation of application No. PCT/CN2022/077689, filed on Feb. 24, 2022.

(30) Foreign Application Priority Data

Jun. 1, 2021 (CN) .......................... 202110606879.4

(51) Int. Cl.
*C30B 25/10* (2006.01)
*C23C 16/46* (2006.01)
*H01L 21/02* (2006.01)

(52) U.S. Cl.
CPC ........ *H01L 21/02365* (2013.01); *C23C 16/46* (2013.01); *C30B 25/10* (2013.01)

(58) Field of Classification Search
CPC . H01L 21/02365; C23C 16/46; C23C 16/458; C30B 25/10; C30B 25/02
See application file for complete search history.

(56) References Cited

U.S. PATENT DOCUMENTS 5,702,532 A * 12/1997 Wen ........................ C30B 25/02
118/726
2007/0065593 A1* 3/2007 Wajda ............... H01L 21/02332
427/532

(Continued)

FOREIGN PATENT DOCUMENTS

CN 1238576C Y 1/2006
CN 101103453 A 1/2008

(Continued)

OTHER PUBLICATIONS

Parihk et al " Implementation of a geometrically based criterion for film uniformity control in a planetary SiC CVD reactor system" / Journal of Process Control 17 (2007) 477-488.*

(Continued)

*Primary Examiner* — Robert M Kunemund (57) ABSTRACT

An epitaxial growth device is provided, which includes an induction coil and a reaction body, and the induction coil is disposed along a circumferential direction of the reaction body; and the reaction body includes a heating base and a plurality of trays, wherein the heating base includes a plurality of workspaces, the plurality of trays are disposed in the plurality of workspaces, respectively, and each of the plurality of trays is disposed in a corresponding workspace; wherein each of the plurality of trays is configured to support (Continued)

a substrate, and each of the plurality of trays is capable of independently rotating relative to the heating base.

7 Claims, 6 Drawing Sheets

(56) References Cited

U.S. PATENT DOCUMENTS

| | | | | |
|---|---|---|---|---|
| 2008/0102199 | A1* | 5/2008 | Gurary | ............... C23C 16/4584 118/52 |
| 2011/0300297 | A1* | 12/2011 | Celaru | ............... C23C 16/4584 118/500 |

FOREIGN PATENT DOCUMENTS

| | | | |
|---|---|---|---|
| CN | 104046959 | A | 9/2014 |
| CN | 210341057 | U | 4/2020 |
| CN | 112111785 | A | 12/2020 |
| CN | 112259479 | A | 1/2021 |
| JP | H9-330884 | A | 12/1997 |
| JP | 2004-55896 | A | 2/2004 |
| JP | 2008311542 | A | 12/2008 |
| KR | 20100089468 | A | 8/2010 |

OTHER PUBLICATIONS

Non-final OA of TW111116536.
First notice of examination opinions of DE11 2022 000 051.1.
International Search Report of PCT/CN2022/077689.
Notice of Reasons for Refusal of JP2022524605.
China Office Action of 202110606879.4.

* cited by examiner

EPITAXIAL GROWTH DEVICE

CROSS-REFERENCE TO RELATED APPLICATION

This application is a continuation of international application No. PCT/CN2022/077689 filed on Feb. 24, 2022, which claims all benefits accruing from China Patent Application No. 202110606879.4, filed on Jun. 1, 2021, and titled "EPITAXIAL GROWTH DEVICE", in the China National Intellectual Property Administration, the content of which is hereby incorporated by reference.

TECHNICAL FIELD

The present disclosure relates to epitaxial growth of semiconductor, in particular to an epitaxial growth device.

BACKGROUND

Epitaxial growth is an important part of a semiconductor industry chain, and quality of an epitaxial film (i.e. an epitaxial layer) directly affects the performance of a subsequent device. With an increasing demand for a semiconductor device with high quality in the industry, an epitaxial device with high efficiency and high quality is gaining more and more attention.

Epitaxial growth mainly refers to growth of a high-quality epitaxial film on a substrate. The epitaxial film can be prepared by a plurality of methods, among which chemical vapor deposition (CVD) is most widely used. The CVD refers to a method to synthesize coatings or nano-materials via reaction of chemical gases or vapors on a surface of the substrate. Two or more raw materials (which are commonly in form of gas) are introduced into a workspace, react to form a new material, and deposit on the surface of the substrate. A rotate speed of the tray and a temperature of the workspace in which the tray lays in are one of important factors affecting a deposition rate, the rotate speed of the tray and temperature uniformity of the workspace directly affect thickness uniformity and doping uniformity of the epitaxial layer.

At present, most of the epitaxial growth devices merely includes one workspace, and a plurality of trays are disposed in one workspace to improve the output. Thus, temperature at different area in the workspace is not balance and rotate speed of the plurality of trays cannot be independently controlled, which greatly affects quality of production.

SUMMARY

In view of this, in order to solve the technical problems in the background, it is necessary to provide an epitaxial growth device.

The present disclosure provides an epitaxial growth device, including an induction coil and a reaction body, and the induction coil is disposed along a circumferential direction of the reaction body; wherein the reaction body includes a heating base and a plurality of trays, wherein the heating base includes a plurality of workspaces, the plurality of trays are disposed in the plurality of workspaces, respectively, and each of the plurality of trays is disposed in a corresponding workspace; and each of the plurality of trays is configured to support a substrate, and each of the plurality of trays is capable of independently rotating relative to the heating base In some embodiments, the plurality of workspaces are disposed along a first direction, and the first direction is perpendicular to an axis of the induction coil.

In some embodiments, the heating base includes a plurality of sub-heating bases, the plurality of workspaces are defined by two adjacent sub-heating bases; and the plurality of trays are disposed on the plurality of sub-heating bases.

In some embodiments, a center line along a direction perpendicular to the axis of the induction coil of one of the plurality of trays is defined as a first center line of one of the plurality of trays, and a beeline distance between the first center line of one of the plurality of trays and a center of the corresponding sub-heating base is in a range of 0 to 20 mm.

In some embodiments, the epitaxial growth device includes a plurality of inlets and a plurality of outlets, each of the plurality of workspaces is provided with a corresponding inlet and a corresponding outlet opposite to each other, the plurality of inlets are configured to import a reaction medium into the plurality of workspaces, and the plurality of outlets are configured to discharge the reaction medium from the plurality of workspaces.

In some embodiments, a direction along which the reaction medium flows from one of the plurality of inlets to one corresponding outlet opposite to the inlet is defined as a second direction, and adjacent two of the plurality of trays are staggered along the second direction.

In some embodiments, a center line along a direction perpendicular to an axis of the induction coil of one of the plurality of trays is defined as a first center line of one of the plurality of trays, and the second direction overlaps with an axis of the induction coil; a line parallel to the axis of the induction coil is defined as a path line, and the first center lines of the adjacent two of the plurality of trays intersect the path line.

In some embodiments, a center line along an axis of the induction coil of the reaction body is defined as a second center line, and a distance between the axis of the induction coil and the second center line is in a range of 0 to 4 mm.

In some embodiments, along the axis of the induction coil, a distance between a center of the induction coil and a center of the reaction body is in a range of 0 to 50 mm.

In some embodiments, the reaction body further includes a supporting body, and the heating base is disposed on the supporting body.

Compared with the conventional growth device, an epitaxial growth device provided in the present disclosure have the following benefits. In the present disclosure, by providing a plurality of trays configured for supporting the substrate, providing each of the plurality of trays with an independent workspace, and independently controlling each of the plurality of trays to rotate, a plurality of epitaxial layers can be generated in one epitaxial growth device at the same time, thereby improving the work efficiency and increasing the output. Since rotate rate of each of the plurality of trays can be independently controlled and each of the plurality of trays can be provided with an independent workspace, the rotate rate of each of the plurality of trays can be independently controlled and environmental parameters in the workspace correspondingly to each of the plurality of trays can be independently controlled, so that environment and rotate rate of each of the plurality of trays can be kept the same, thereby thicknesses and doping levels of the product generated in each of the plurality of workspaces can be uniform. The epitaxial growth device provided in the present disclosure can ensure uniformity and quality of products in the same batch.

Furthermore, along an axis of the induction coil, magnetic field strength generated in the induction coil are not the same. If the plurality of workspaces are arranged along the axis of the induction coil, the magnetic field strength in which the plurality of workspaces lay are different, so that temperature differences between the plurality of workspaces are great, thereby affecting quality of the epitaxial layers. In the present disclosure, by disposing the plurality of workspaces along a direction perpendicular to the axis of the induction coil, the plurality of workspaces can be disposed in the same magnetic field, so that temperature difference between the plurality of workspaces can be reduced, thereby ensuring temperature uniformity between the plurality of workspaces and improving quality of the product. Thus, the quality of the epitaxial layer produced in each of the plurality of workspaces can be improved while improving the output.

Callouts in the figures are shown herein.

100 represents a epitaxial growth device; 200 represents a reaction body; 300 represents an induction coil; 1 represents a heating base; 11 represents a first sub-heating base; 12 represents a second sub-heating base; 13 represents a third sub-heating base; 14 represents a supporting groove; 15 represents a locating column; 16 represents an air floating channel; 2 represents a tray; 3 represents a supporting body; 31 represents a first insulation blanket; 32 represents a second insulation blanket; 33 represents an end cover; 34 represents a first step; 35 represents a second step; 4 represents a workspace; 5 represents an inlet; 6 represents an outlet; 7 represents an air supply port; 8 represents a supporting member; and 9 represents a substrate.

The present disclosure will be further described in conjunction with the callouts above and the embodiments hereinafter.

DETAILED DESCRIPTION

The technical solutions in the embodiments of the present disclosure will be clearly and completely described below with reference to the accompanying drawings in the embodiments of the present disclosure. Obviously, the described embodiments are only a part of the embodiments of the present disclosure, but not all of the embodiments. Based on the embodiments in the present disclosure, all other embodiments obtained by one of ordinary skill in the art without creative efforts shall fall within the protection scope of this disclosure.

It should be noted that when a component is referred to as being "mounted on" another component, it can be directly mounted on the other component or there may also be an intervening component. When a component is considered to be "set on" another component, it may be directly set on the other component or there may be a co-existing centered component. When a component is said to be "fixed" to another component, it may be directly fixed to the other component or there may also be an intervening component.

Unless otherwise defined, all technical and scientific terms used in this disclosure have the same meaning as commonly understood by one of ordinary skill in the art to which this disclosure belongs. Terms used in the specification of the present disclosure are for the purpose of describing specific embodiments only and are not intended to limit the present disclosure. As used herein, the term "or/and" includes any and all combinations of one or more of the associated listed items.

Most of the conventional epitaxial growth devices incudes only one workspace, leading to low heat utilization rate of the epitaxial growth device. When the workspace is provided with one tray, the production efficiency is low. In order to improve output, a plurality of trays are commonly disposed in the workspace. However, simulation testing shows that temperatures at different arear of the workspace are not uniform, leading to temperature differences between the plurality of trays. However, temperature is one of the critical factors affecting the deposition rate. In addition, the plurality of trays moves along with a heating base supporting the plurality of trays, and the rotate rate of each of the plurality of trays cannot be independently controlled. In view of above, in conventional art, quality of the epitaxial layers produced in a batch are irregular, and the quality of the epitaxial layers cannot be ensured.

Furthermore, some of the epitaxial growth device in conventional art includes a plurality of workspaces. However, temperature differences between the workspaces of the conventional epitaxial growth device are great. Temperature uniformity of the workspaces directly affect uniformity of thickness of the epitaxial film and doping uniformity of the epitaxial film, and great temperature difference between the plurality of chambers will affect the quality of the epitaxial layer. Research found that great temperature difference between the plurality of workspaces of the epitaxial growth device having a plurality of workspaces in conventional art are caused by the plurality of workspaces and the heating base disposing along an axis of the induction coil. Along an axis of the induction coil, magnetic field strength generated in the induction coil are not the same. If the plurality of workspaces are arranged along the axis of the induction coil, the magnetic field strength in which the plurality of workspaces lay are different, so that temperature differences between the plurality of heating base are great, thereby causing great temperature difference between the plurality of workspaces. In addition, if each of the plurality of workspaces is provided with an independent induction coil, the magnetic fields generated by each of the plurality of induction coils are different, so that temperature difference between the plurality of workspaces are great.

Referring to FIG. 1 to FIG. 6 and FIG. 10, the present disclosure provides an epitaxial growth device 100, which can include an induction coil 300 and a reaction body 200. The induction coil 300 can be disposed along a circumferential direction of the reaction body 200, and the reaction body 200 can be configured to accommodate the substrate 9 and heat the substrate 9. The reaction body 200 can include a heating base 1 and a plurality of trays 2, wherein the heating base 1 can include a plurality of workspaces 4, the plurality of trays 2 can be disposed in the plurality of workspaces 4, respectively, and each of the plurality of trays 2 can be disposed in a corresponding workspace 4. Each of the plurality of trays 2 can be configured to support a substrate 9, and each of the plurality of trays 2 can be capable of independently rotating relative to the heating base 1. It should be understood that heat of the workspace 4 sourced from induction heat generated by the heating base 1 under electro-magnetic induction of the induction coil 300, and then the substrate 1 can heat the tray 2 and the substrate 9. Two or more raw materials (which are commonly in form of gas) can be introduced into the plurality of workspaces 4, react to form a new material, and deposit on the surface of the plurality of substrates 9. In some embodiments of the present disclosure, the reaction medium can be in form of gas. In some embodiments, the state of the reaction medium can be chosen according to the epitaxial layer to be produced.

In the present disclosure, by disposing a plurality of trays 2 in the epitaxial growth device 100 to product the epitaxial layer, a plurality of epitaxial layers can be produced in a batch, thus production efficiency and output can be improved. Each of the plurality of trays 2 in the present disclosure can be independently controlled to rotate, so that the rotate of each of the plurality of the trays 2 can meet the standard. In addition, each of the plurality of trays 2 can be provided with an independent workspace 4, so that environment in the workspace 4 containing the tray 2 can be correspondingly controlled, thereby ensuring uniformity of temperature of the plurality of trays 2. The rotate rate of the plurality of trays can be controlled to the same, so that high-quality epitaxial layers having uniform thickness and uniform doping can be produced. In the present disclosure, the epitaxial growth device 100 can not only improve the output, but also ensure quality and uniformity of a batch of product.

In some embodiments, the plurality of workspaces 4 can be disposed along a first direction, and a direction perpendicular to an axis of the induction coil 300 can be defined as the first direction. Thus, the plurality of workspaces 4 can be disposed in the same magnetic field, and the plurality of workspaces 4 can share the same induction coil 300, so that temperature difference between the plurality of workspaces 4 can be reduced, thereby ensuring temperature uniformity in the plurality of workspaces 4, improving quality of the product and lowering difference between a batch of products. In some embodiments, the plurality of workspaces are not limited to be arranged in the above method. For example, the plurality of workspaces can be arranged along the axis of the induction coil, or the plurality of workspaces can be arranged on the same horizontal plane.

Figure 2:
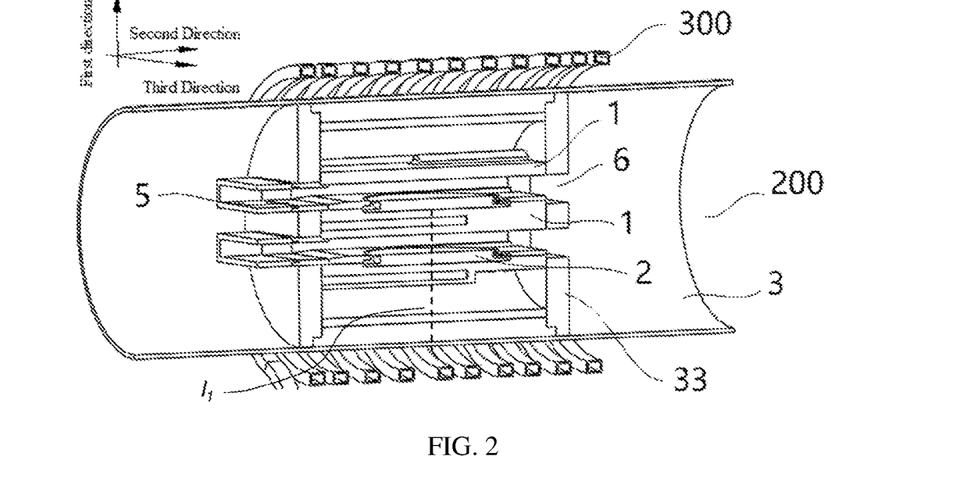
FIG. 2 is a cross section view of a reaction body in FIG. 1.

In some embodiments, referring to FIG. 2, a center line along the axis of the induction coil 300 of the reaction body 200 can be defined as a second center line. The second center line can be parallel with the axis of the induction coil 300, and the plurality of workspaces 4 can be disposed in the middle area of the induction coil 300. Since along an axis of the induction coil 300, magnetic field strength generated in the induction coil 300 are not the same. The magnetic generated at two ends of the induction coil 300 and the magnetic field generated in the middle of the induction coil 300 are different, and the magnetic field generated at two ends of the induction coil 300 are not stable, resulting in that temperatures differences of the workspaces 4 at two ends of the induction coil 300 are great. Therefore, the plurality of workspaces 4 can be disposed in the middle part of the induction coil 300.

In the present disclosure, the heating base 1 can be integrally formed, or formed in a divided structure. For example, referring to FIG. 1 to FIG. 6, the heating base 1 can include a plurality of sub-heating bases. The plurality of workspaces 4 can be defined by adjacent two sub-heating bases of the plurality of sub-heating bases; and the plurality of trays 2 can be disposed on the plurality of sub-heating bases. In other words, adjacent two workspaces 4 can share one sub-heating base. In the present disclosure, adjacent two workspaces 4 sharing one sub-heating base can make full use of heat of the sub-heating base disposed in adjacent two workspaces, thereby improving utilization rate of heat and decreasing production cost.

Referring to FIG. 1 to FIG. 6, in some embodiments, a number of the sub-heating base can be three. The sub-heating base can be defined as a first sub-heating base 11, a second sub-heating base 12 and a third sub heating base 13. Thus, the first sub-heating base 11 and the second sub-heating base 12 can define one workspace 4; and the second sub-heating base 12 and the third sub-heating base 13 can define another workspace 4. The adjacent two workspaces 4 can share the sub-heating base disposed therebetween, e.g., sharing the second sub-heating base 12 and improving utilization rate of heat. In some embodiments, the number of the sub-heating base is not limited to that above or those shown in the figures, and the number of the sub-heating base can be larger than or equal to three.

Along a first direction, a shape of the sub-heating base at the bottom and a shape of the sub-heating base at the top can be the same, and a center line along the axis of the induction coil 300 of the reaction body 200 can be defined as a second center line. The two sub-heating base can be symmetrically disposed about the second center line, so that the whole reaction body 200 can be approximately symmetric, thereby reducing temperature difference between the plurality of workspaces 4. In some embodiments, referring to FIG. 3 and FIG. 4, a shape of the first sub-heating base 11 and a shape of the third sub-heating base 13 can be similar. For example, both the same of the first sub-heating base 11 and the shape of the third sub-heating base 13 can be crescent-shaped, and the second sub-heating base 12 can be in plane-shaped. In some embodiments, the shape of the first sub-heating base 11 and the shape of the third sub-heating base 13 are not limited to those above. For example, in FIG. 6, the shape of the first sub-heating base 11, the shape of the second sub-heating base 12 and the shape of the third sub-heating base 13 are not the same, wherein the shape of the second sub-heating base 12 is crescent-shaped, the shape of the third sub-heating base 13 is plane-shaped, and the third sub-heating base 13 can be supported by the second sub-heating base 12. It should be understood that the shape of the heating base is not limited to those shown above or in the figures and can be in other shapes.

Figure 3:
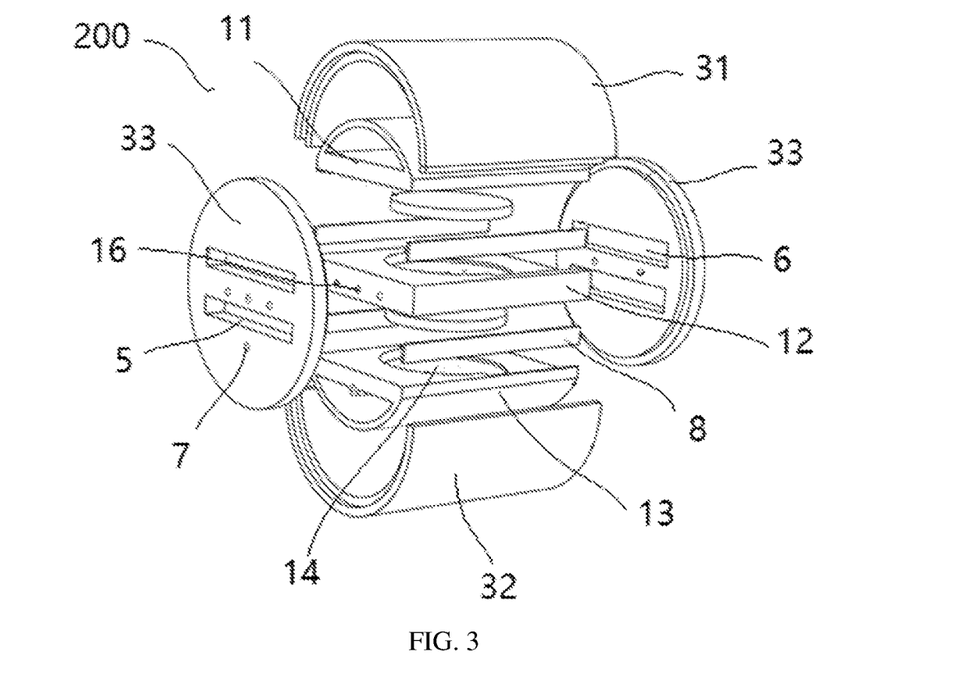
FIG. 3 is an explosive view of a reaction body in an embodiment of the present disclosure.
Figure 5:
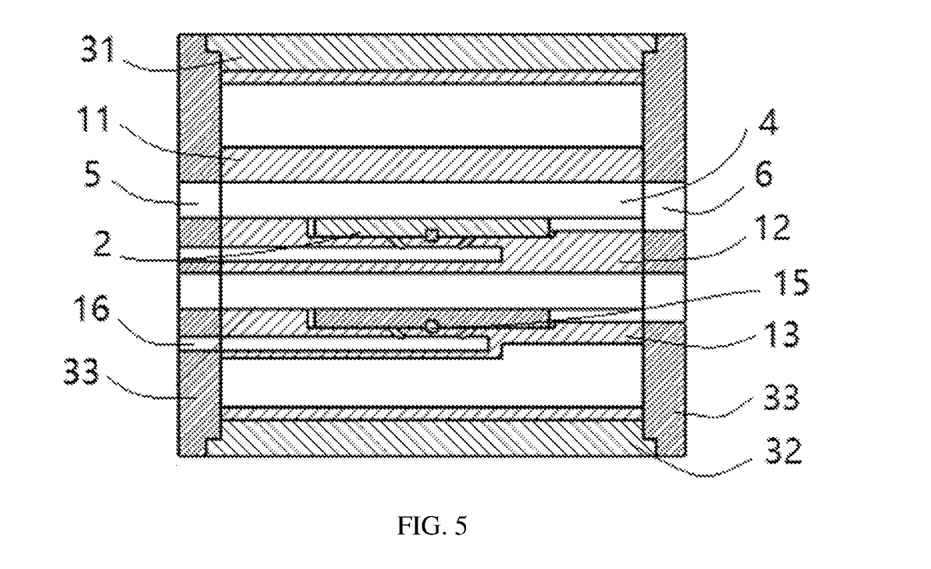
FIG. 5 is a cross section view of a reaction body in FIG. 3.

Furthermore, referring to FIG. 3 and FIG. 5, the sub-heating base for supporting the plurality of tray 2 can be provided with a plurality of supporting grooves 14, and the plurality of supporting grooves 14 can be configured for supporting the plurality of trays 2. In some embodiments, both the second sub-heating base 12 and the third sub-heating base 13 for supporting the tray 2 can be provided with the supporting groove 14.

Figure 4:
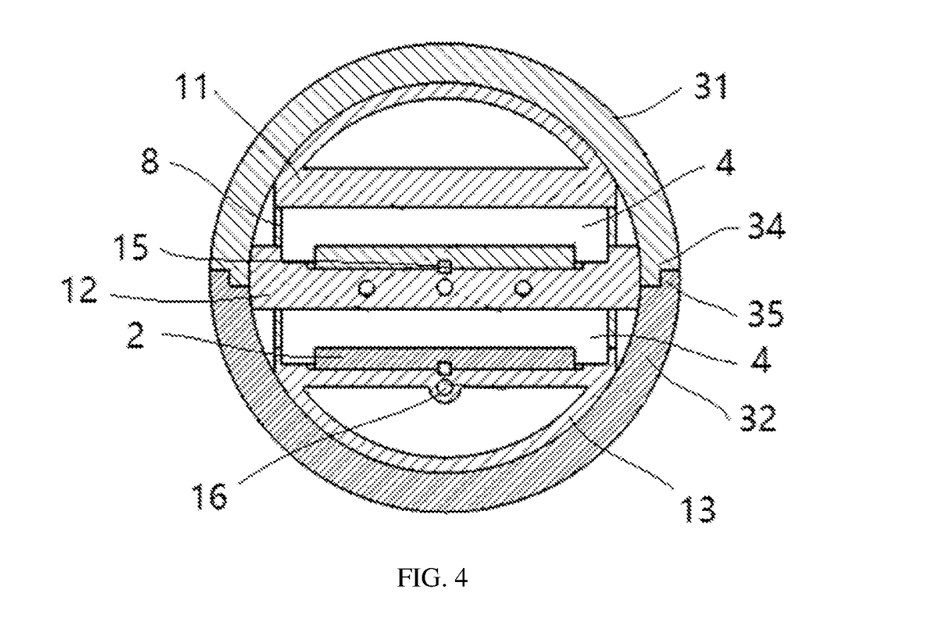
FIG. 4 is a cross section view of a reaction body in FIG. 3.

Furthermore, referring to FIG. 4 and FIG. 5, an axis of the supporting groove 14 can be provided with a locating column 15. The locating column 15 can stretch along the first direction, the tray 2 can be rotatably disposed on the locating column 15 and coaxially disposed with the locating column 15.

Referring to FIG. 4 and FIG. 5, the sub-heating base configured for supporting the plurality of trays 2 can be provided with a plurality of air floating channel 16. The air plurality of floating channel 16 can be connected to and communicated with the plurality of supporting groove 14 and the external of the reaction body 200, respectively. The spiral part at the bottom of the plurality of trays 2 can be provided with a plurality of stripe-shaped grooves (not shown in the figures). Under vacuum condition, a small amount of gas can be imported into an air floating channel 16, so that the gas can drive the corresponding tray 2 to suspend and rotate around the locating column 15, thereby independently controlling each of the plurality of trays 2 and driving the substrate 9 disposed on the tray 2 to rotate. Therefore, during the epitaxial growth process, each substrate 9 can be uniformly heated, and the airflow on the substrate can be uniformly disposed, thereby ensuring uniform thickness of the epitaxial growth layer. In some embodiments, amounts of inert gas imported into the plurality of air floating channel 16 are the same, thus rotate rates of the corresponding trays 2 can be the same, which effectively improve uniformity of temperature and the airflow of the plurality of trays, thereby ensuring uniformity of thickness of the epitaxial layers generated on the plurality of substrate 9 and ensuring quality of the product in a batch. In some embodiments, the plurality of trays are not limited to be independently controlled by the air floating channels described above. Each of the plurality of trays can be provided with an independent driving member to control the tray 2 to independently rotate.

In some embodiments, a center line along a direction perpendicular to the axis of the induction coil 300 of one of the plurality of trays 2 can be defined as a first center line of one of the plurality of trays (shown ash in FIG. 2), that is, a center line of the tray 2 along a first direction is the first center line. A beeline distance between the first center line of one of the plurality of trays 2 and a center of the corresponding sub-heating base can be in a range of 0 to 20 mm, so as to ensure the plurality of substrates 9 on the plurality of trays 2 can be located in the middle part of the sub-heating base. Adjusting relative positions of the plurality of trays 2 and the plurality of sub-heating bases in the range can improve uniformity of temperature in areas on the plurality of trays. In some embodiments, the beeline distance between the first center line of one of the plurality of trays 2 and a center of the corresponding sub-heating base can be not limited to the range above. The specific range of the distance between the tray 2 and the center of the sub-heating base can be adjusted according to actual volume of the epitaxial growth device 100 and the volume of the heating base.

Referring to FIG. 2, FIG. 3 and FIG. 5, each of the plurality of workspaces can be provided with an inlet 5 and an outlet 6 opposite to each other. The plurality of inlets 5 can be configured to import a reaction medium into the plurality of workspaces 4, and the plurality of outlets 6 can be configured to discharge the reaction medium from the plurality of workspaces 4.

Figure 7:
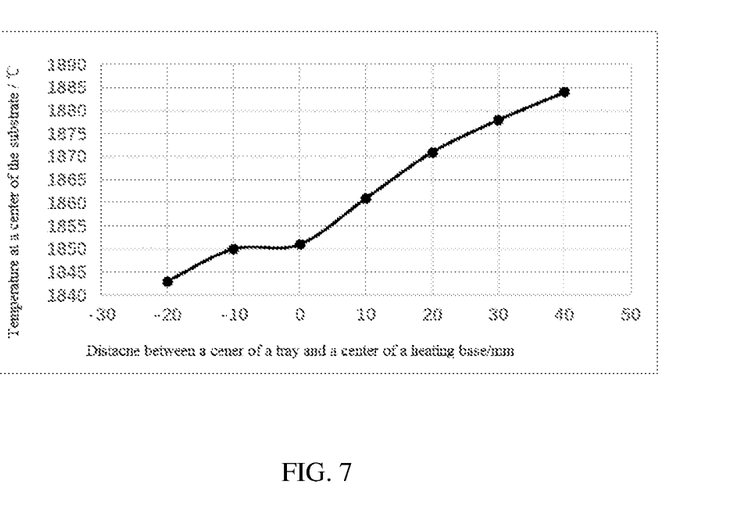
FIG. 7 is a temperature curve showing temperature change at the center of a substrate with change of a position of the sub-heating base (which is an analogue stimulation of the reaction body in FIG. 3).
Figure 8:
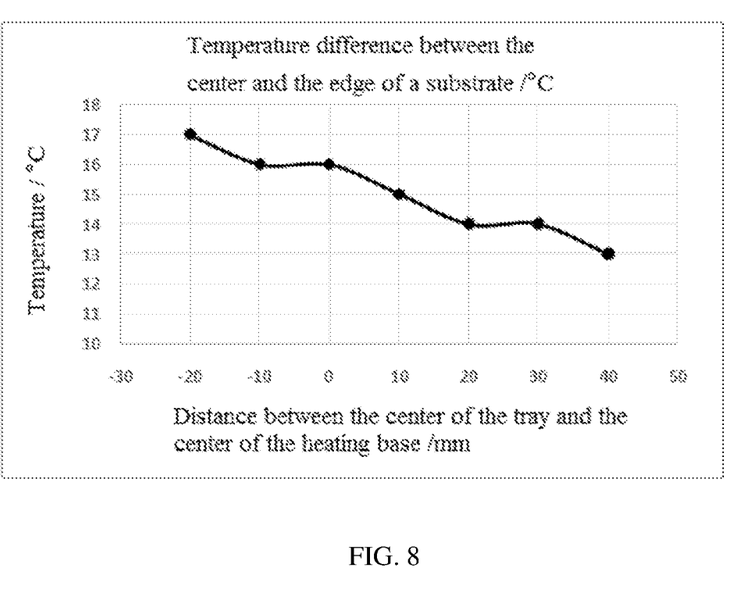
FIG. 8 is a variation curve of temperature difference between a center of the substrate and an edge of the substrate when the plurality of trays are disposed along an axis of the induction coil (which is an analogue stimulation of the reaction body in FIG. 3).

Furthermore, a direction along which the reaction medium flows from one of the plurality of inlets 5 to one corresponding outlet 6 opposite to the inlet 5 can be defined as a second direction, and adjacent two trays 2 can be staggered along the second direction. It should be understood that under the same condition, maximum temperature of the substrates 9 disposed on adjacent tow sub-heating bases can be different. When the reaction gas flows from the inlet 5 to the outlet 6 along the second direction, a temperature of the gas gradually increases. Therefore, by staggering adjacent two trays 2 along the second direction, temperature difference between the adjacent two trays 2 can be made up by the heat of the gas while the gas flows, so that temperature difference between adjacent two trays can be reduced as much as possible, thereby reducing temperature difference between the adjacent two substrates 9. Therefore, when adjacent two trays 2 are staggered along the second direction, the temperature regulation can be optimum. Spatial positions of the plurality of trays 2 can be adjusted by directly regulating positions of the plurality of trays 2 on the plurality of sub-heating bases, or the spatial positions of the plurality of trays 2 can be adjusted by adjusting the spatial positions of adjacent sub-heating bases. Specific adjusting effect is shown in FIG. 7 and FIG. 8. FIG. 7 is a temperature curve showing temperature change at the center of a substrate 9 with change of a position of the sub-heating base disposed on the tray 2. FIG. 8 is a variation curve of temperature difference between a center of the substrate 9 and an edge of the substrate 9 when the plurality of trays 2 are disposed along an axis of the induction coil 300.

Referring to FIG. 1 to FIG. 8, in some embodiments, the reaction medium can flow along an axis of the induction coil 300, and the second direction can be an axial direction of the induction coil 300; wherein a line parallel to the axis of the induction coil 300 can be defined as a path line, and the first center lines of adjacent two trays 2 can intersect with the path line. In other words, adjacent two trays 2 can be arranged along the axis of the induction coil 300 or the same path line, so that adjacent two trays 2 can be staggered along an optimal second direction. In addition, the positions of the plurality of trays 2 can be adjusted by adjusting spatial positions of the plurality of sub-heating bases, so that displacement of adjacent two sub-heating bases along a third direction can be avoided, thus preventing a volume of the reaction body from increasing while balancing the temperature. The third direction can be perpendicular to both the first direction and the second direction at the same time.

In actual use of some embodiments, temperatures of the plurality of substrates 9 on the plurality of sub-heating base can be different, and relative positions between the induction coil 300 and the reaction body 200 can be adjusted. By adjusting the induction coil 300 along the first direction, temperature differences between the plurality of sub-heating bases can be made up, so that temperature distribution of the plurality of trays 2 on the sub-heating bases and the plurality of substrates 9 can be more uniform, and temperature difference between the plurality of substrates 9 can be reduced.

Figure 9:
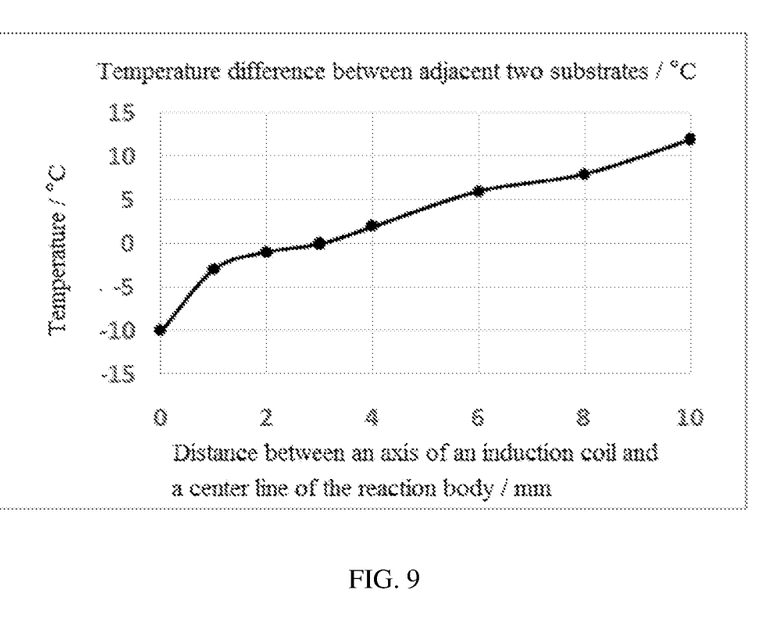
FIG. 9 is a variation curve of temperature difference of substrates on adjacent two trays when the induction coil moves along the first direction (which is an analogue stimulation of the reaction body in FIG. 3).
Figure 10:
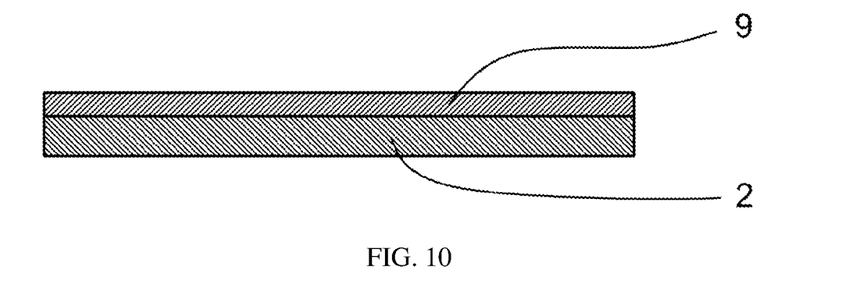
FIG. 10 is a schematic diagram of a tray and a substrate in an embodiment of the present disclosure.

In some embodiments, referring to FIG. 9, FIG. 9 is a variation curve of temperature difference of substrates 9 on adjacent two trays 2 when the induction coil moves along the first direction. Changing relative positions of the induction coil 300 and the reaction body 200 along the first direction can make up temperature difference between the plurality of the substrate 9.

In some embodiments, and a distance between the axis of the induction coil 300 and the second center line of the reaction body 200 can be in a range of 0 to 4 mm. When relative positions between the induction coil 300 and the reaction body 200 are slightly adjusted in the range of distance, effect of temperature regulation can be optimal. In some embodiments, the distance between the axis of the induction coil 300 and the second center line of the reaction body 200 are not limited to the distance above, and the relative distance between the induction coil 300 and the reaction body 200 can be obtained by stimulation testing.

In some embodiments, the relative position between the induction coil 300 and the reaction body 200 can be regulated by moving the induction coil 300 along the axis of the induction coil 300, so as to regulate temperature distribution of the plurality of substrates 9 disposed in the plurality of workspaces 4. When the structure and electric parameters of the induction coil 300 are invariant, movement of the induction coil 300 along the axis of the induction coil 300 can influence temperature distribution of the entire reaction body 200, thereby affecting the temperature distribution of the plurality of substrates 9 disposed in the plurality of workspaces 4, and influencing the quality of the epitaxial layer.

In some embodiments, along the axis of the induction coil, a distance between a center of the induction coil 300 and a center of the reaction body 200 can be in a range of 0 to 50 mm. In some embodiments, the distance between a center of the induction coil 300 and a center of the reaction body 200 are not limited to the above range, and the relative position between the induction coil 300 and the reaction body 200 can be regulated according to the volume of the device and the result of the stimulation testing.

Figure 6:
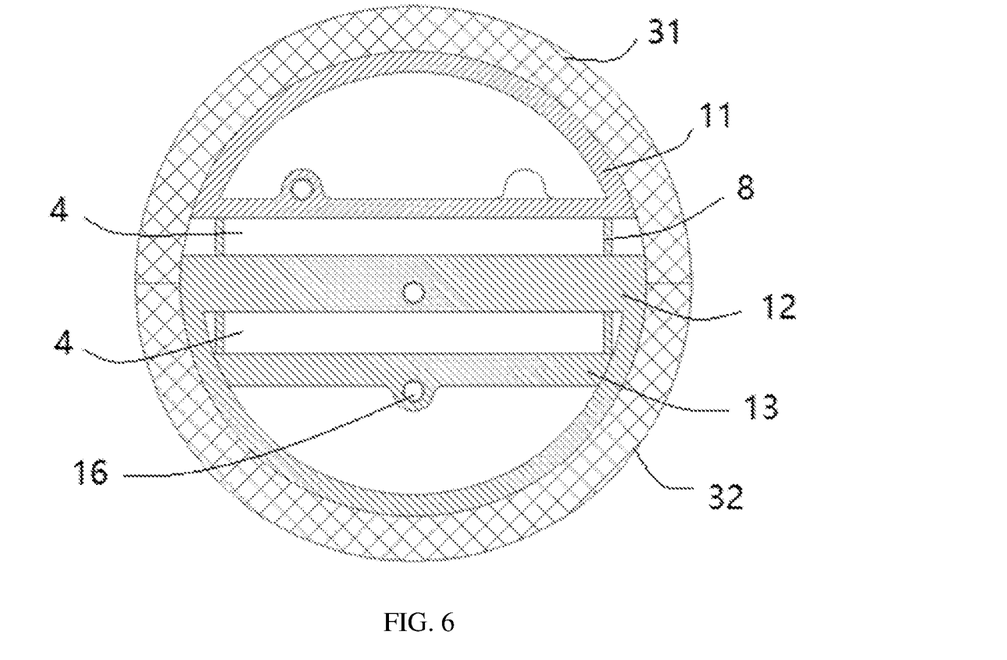
FIG. 6 is a cross section view of a reaction body in another embodiment of the present disclosure.

Referring to FIG. 3, FIG. 4, and FIG. 6, the reaction body 200 can include a supporting member. The supporting member can be disposed between adjacent two sub-heating bases and define a chamber wall of the workspace 4. In some embodiments, a supporting member 8 can be disposed between the first sub-heating base 11 and the second sub-heating base 12, and the supporting member 8 can define a side wall of the workspace 4.

Figure 1:
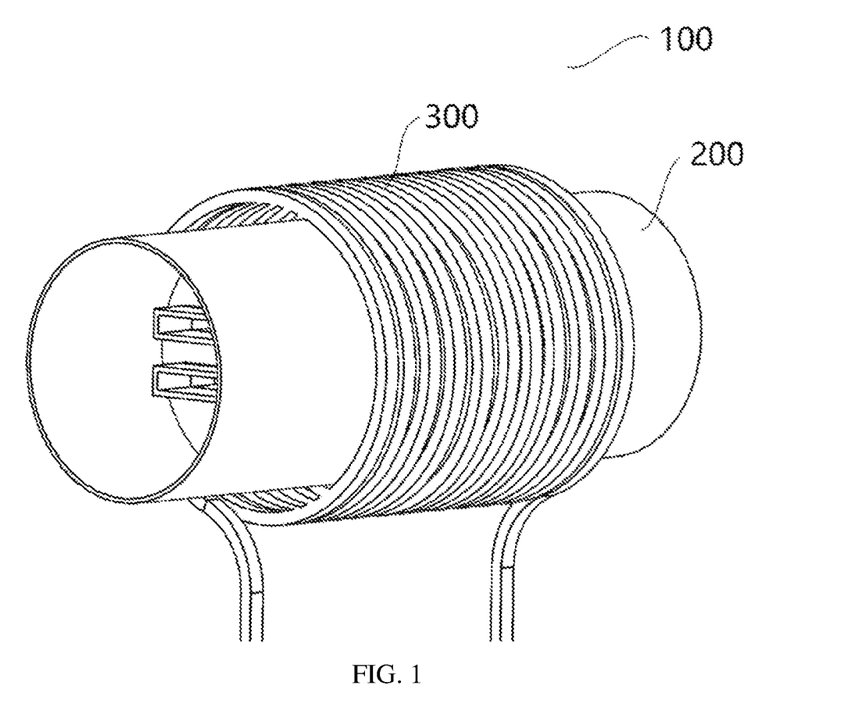
FIG. 1 is a schematic diagram of an epitaxial growth device in an embodiment of the present disclosure.

Referring to FIG. 1 and FIG. 2, the reaction body 200 can include a supporting body 3, and the heating base 1 can be disposed on the supporting body 3.

Furthermore, the supporting body 3 can have a symmetric structure. In some embodiments, referring to FIG. 2 and FIG. 3, the supporting body 3 can include an insulation cylinder and two end covers 33. The two end covers 33 can be coved on both ends of the insulation cylinder, respectively. The heating base 1 can be disposed in the insulation cylinder, and configured to keep the plurality of workspaces 4 warm and prevent heat from losing. The two end covers 33 can further be made of a thermal insulation material. Correspondingly, the inlet 5 and the outlet 6 can be disposed on the two end covers 33, respectively. The end cover 33 provided with the inlet 5 can be provided with an air supply port 7 connecting to and communicating with the air floating channel 16. The inert gas can be imported into the air supply port 7 and the air floating channel 16 via an external pipeline.

In some embodiments, the insulation cylinder can include a first insulation blanket 31 and a second insulation blanket 32, and the first insulation blanket 31 and the second insulation blanket 32 can define the insulation cylinder. In some embodiments, the first insulation blanket 31 can be provided with a first step 34, and the second insulation blanket 32 can be provided with a second step 35 matching with the first step 34. In the assembly process, the first step 34 can match with the second step 35, so that the first insulation blanket 31 can cooperate with the second insulation blanket 32 and define the insulation cylinder. In some embodiments, the method for connecting the first insulation blanket 31 with the second insulation blanket 32 is not limited to those above. For example, the first insulation blanket 31 and the second insulation blanket 32 can be integrally formed or connected via connecting structures such as a fastener, and the like.

In view of above, referring to FIG. 3 to FIG. 5, operation process of the present disclosure is shown hereinafter.

Taking epitaxial growth of silicon carbide as example, the silicon carbide substrate 9 can be disposed on a plurality of trays 2 which are disposed in a plurality of workspaces 4, respectively, and the plurality of trays 2 can be disposed and stagger along a direction that the reaction medium flows. Along the first direction, since temperatures in the workspaces at the top of the epitaxial growth device are relatively high, and the plurality of workspaces 4 are under a low-pressure environment, assembly position of the induction coil 300 can be adjusted according to stimulation testing. That is, when relative position between the induction coil 300 and the reaction body 200 are adjusted, the induction coil 300 can be commonly moved down along a first direction, so that center of the heat flow of the induction coil 300 can be lowered, thereby balancing the temperature of the heating base along the first direction. The induction coil 300 can be electrified to heat a plurality of sub-heating base until the temperature in the two workspaces reach the processing temperature of epitaxial growth. Inert gases such as hydrogen, argon and the like with the same amounts can be imported into a plurality of air floating channel 16 on the second sub-heating base 12 and the third sub-heating base 13. The airflow can drive the two trays 2 to rotate at the same speed, thereby improving temperature uniformity in the two workspaces 4. Then, reaction gases can be imported into the two workspaces 4 in the same amount, and the reaction gas can form an epitaxial layer on the silicon carbide substrate 9.

In some embodiments, the epitaxial growth device of the present disclosure can not only be used in epitaxial growth of silicon carbide, but also be used in epitaxial growth of other semiconductor.

The technical features of the above-described embodiments may be combined in any combination. For the sake of brevity of description, not all possible combinations of the technical features in the above embodiments are described. However, as long as there is no contradiction between the combinations of these technical features, all should be considered as within the scope of this disclosure.

The above-described embodiments are merely illustrative of several embodiments of the present disclosure, and the description thereof is relatively specific and detailed, but is not to be construed as limiting the scope of the disclosure. It should be noted that a number of variations and modifications may be made by those skilled in the art without departing from the spirit and scope of the disclosure. Therefore, the scope of the disclosure should be determined by the appended claims.

We claim:
1. An epitaxial growth device, comprising an induction coil and a reaction body, wherein the induction coil is disposed along a circumferential direction of the reaction body, and the reaction body comprises a heating base and a plurality of trays,
   wherein the heating base comprises a plurality of workspaces, the plurality of trays are disposed in the plu- rality of workspaces, respectively, and each of the plurality of trays is disposed in a corresponding workspace;

each of the plurality of trays is configured to support a substrate, and each of the plurality of trays is capable of independently rotating relative to the heating base;

the epitaxial growth device comprises a plurality of inlets and a plurality of outlets, each of the plurality of workspaces is provided with a corresponding inlet and a corresponding outlet opposite to each other, the plurality of inlets are configured to import a reaction medium into the plurality of workspaces, and the plurality of outlets are configured to discharge the reaction medium from the plurality of workspaces;

a direction along which the reaction medium flows from one of the plurality of inlets to one corresponding outlet opposite to the inlet is defined as a second direction, and adjacent two of the plurality of trays are staggered along the second direction; and a center line along a direction perpendicular to an axis of the induction coil of one of the plurality of trays is defined as a first center line of one of the plurality of trays, and the second direction overlaps with the axis of the induction coil; a line parallel to the axis of the induction coil is defined as a path line, and the first center lines of the adjacent two of the plurality of trays intersect the path line.

2. The epitaxial growth device of claim 1, wherein the plurality of workspaces are disposed along a first direction, and the first direction is perpendicular to an axis of the induction coil.

3. The epitaxial growth device of claim 2, wherein the heating base comprises a plurality of sub-heating bases, the plurality of workspaces are defined by two adjacent sub-heating bases; and the plurality of trays are disposed on the plurality of sub-heating bases.

4. The epitaxial growth device of claim 3, wherein a center line along a direction perpendicular to the axis of the induction coil of one of the plurality of trays is defined as a first center line of one of the plurality of trays, and a distance between the first center line of one of the plurality of trays and a center of a corresponding sub-heating base is in a range of 0 to 20 mm.

5. The epitaxial growth device of claim 2, wherein a center line along the axis of the induction coil of the reaction body is defined as a second center line, and a distance between the axis of the induction coil and the second center line of the reaction body is in a range of 0 to 4 mm.

6. The epitaxial growth device of claim 1, wherein along an axis of the induction coil, a distance between a center of the induction coil and a center of the reaction body is in a range of 0 to 50 mm.

7. The epitaxial growth device of claim 1, wherein the reaction body further comprises a supporting body, and the heating base is disposed on the supporting body.

\* \* \* \* \*